United States Patent [19]

Gärtner et al.

[11] Patent Number: 5,283,085
[45] Date of Patent: Feb. 1, 1994

[54] METHOD OF MANUFACTURING A HOT-CATHODE ELEMENT

[75] Inventors: Georg Gärtner, Aachen; Peter Janiel, Würselen, both of Fed. Rep. of Germany

[73] Assignee: U.S. Philips Corporation, New York, N.Y.

[21] Appl. No.: 870,655

[22] Filed: Apr. 20, 1992

[30] Foreign Application Priority Data

Apr. 22, 1991 [DE] Fed. Rep. of Germany ....... 4113085

[51] Int. Cl.⁵ ..................... B05D 3/04; B05D 5/10; C23C 16/40; C23C 16/50
[52] U.S. Cl. ..................................... 427/534; 427/535; 427/539; 427/569; 427/571; 427/576; 427/69; 427/126.1; 427/126.3; 427/255.7; 204/241
[58] Field of Search ............... 427/534, 535, 539, 569, 427/571, 576, 64, 69, 70, 126.1, 126.3, 250, 253, 255.1, 255.3, 255.7; 204/241

[56] References Cited

U.S. PATENT DOCUMENTS

| | | |
|---|---|---|
| 2,501,563 | 3/1950 | Colbert et al. ..................... 427/539 |
| 4,487,880 | 12/1984 | Ueno et al. ........................ 427/539 |
| 4,713,259 | 12/1987 | Gartner et al. .................... 427/126.3 |
| 4,751,101 | 6/1988 | Joshi ................................. 427/539.5 |

FOREIGN PATENT DOCUMENTS 57-187382 11/1982 Japan.
59-226592 12/1984 Japan.
63-266740 11/1988 Japan.

*Primary Examiner*—Terry J. Owens
*Assistant Examiner*—Bret Chen
*Attorney, Agent, or Firm*—Norman N. Spain

[57] ABSTRACT

A method of manufacturing a hot-cathode element which consists of a rare-earth-oxide-doped refractory metal, notably thoriated tungsten, and which also contains carbon components, first a plurality of layers of the hot-cathode element being successively deposited on a substrate member (2) by means of a CVD process, after which notably the hot-cathode element is separated from the substrate member (2). The strength required for further working of the hot-cathode element is improved in that in the course of the CVD process decarburizing intermediate treatments are performed, the hot-cathode element being carburized during an aftertreatment.

9 Claims, 2 Drawing Sheets

METHOD OF MANUFACTURING A HOT-CATHODE ELEMENT

BACKGROUND OF THE INVENTION

The invention relates to a method of manufacturing a hot-cathode element from a rare-earth-oxide-doped refractory metal where initially a plurality of sub-layers of the hot-cathode element are successively deposited on a substrate member by means of a CVD process. The invention also relates to a cathode ray tube comprising such a hot-cathode element.

A method of this kind is described in EP-A-0204 356. Therein, during a plasma-activated CVD coating (PCVD) of an inner surface of a substrate cylinder, tungsten carbide ($W_2C$) is also introduced into a hot-cathode element consisting of thoriated tungsten. Because of the C-content, during and after the later activation of the hot-cathode element during operation, the formation and sustenance of an approximately monatomic film of thorium on the surface of the hot-cathode element at comparatively low temperatures of approximately 2000K is stimulated. The $W_2C$ which is important for the operation of a thoriated tungsten cathode ensures that metallic thorium is released via the reaction $ThO_2 + 2W_2C \rightarrow Th + 4W + 2CO \uparrow$ and is diffused along the grain boundaries to the surface where it supplements the essentially monatomic Th film deposited at that area. On the other hand, the carbon content causes embrittlement of the hot-cathode element, so that it must be very carefully handled in order to avoid fractures.

SUMMARY OF THE INVENTION

It is the object of the invention to conceive the method of the kind set forth so that the mechanical strength of the hot-cathode element, required for further working, is improved.

This is achieved in that decarburizing intermediate treatments are executed in the course of the CVD process, and in that subsequently the hot-cathode element is carburized by an aftertreatment.

In accordance with the invention, CVD layers are decarburized in the CVD reactor, even through a given carbon component is desired in the hot-cathode element. Recarburization is performed only after the hot-cathode element need no longer be subjected to mechanical loading inducing the risk of fracture, preferably after its connection to a supporting member provided for building the element into a tube. After building into a high-frequency tube, an X-ray tube or a hot-cathode test rig, the hot-cathode elements supported by the supporting member are annealed in a hydrocarbon gas atmosphere. The embrittlement then occurring is no longer critical since the element has already been connected to a supporting member and is no longer effective anyway at cathode operating temperatures beyond 2000K.

DETAILED DESCRIPTION OF THE INVENTION

Figure 1:
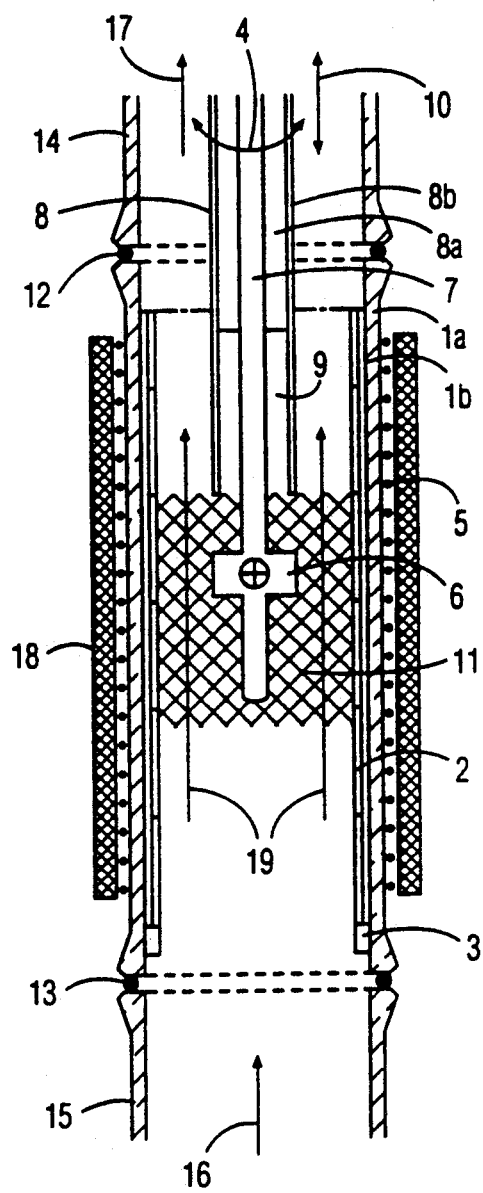
FIG. 1 is a diagrammatic sectional view of a device for carrying out glow-dischargeactivated reactive depositions.

Substantially complete decarburization is achieved by depositing on the substrate member alternating layers of a refractory metal, notably tungsten, and a rare-earth oxide, notably $ThO_x$, after depositing each layer of rare-earth oxide there is performed a decarburizing plasma intermediate treatment, notably with $Ar/O_2$.

Any detrimental W oxides formed by the after oxidation in the $O_2/Ar$ plasma can be eliminated, if necessary, by performing a $H_2/Ar$ plasma intermediate treatment after deposition of a tungsten layer.

The method in accordance with the invention can be used for manufacturing hot-cathode elements of arbitrary shape. However, it is particularly suitable for the manufacture of very sensitive cylindrical hot-cathode elements deposited on the inner wall of a cylindrical substrate member. The layers are then preferably deposited by plasma-activated CVD (PCVD).

The brittleness of hot-cathode elements manufactured in accordance with the invention is further reduced when rhenium is co-deposited with W in the hot-cathode element. The co-deposition of Re in amounts of up to a few percents takes place together with W from a $ReF_6WF_6/H_2$ mixture.

The substrate member is preferably made of a metal cylinder, notably a copper cylinder, whose inner surface has a surface roughness of less than 1 $\mu m$.

It should be noted that if substrate cylinders were made by turning thick tubes and if a groove structure and roughness of up to 10 $\mu m$ were tolerated, the unevenness would appear as an imprint on the outer surface of the hot-cathode element where it would lead to fracture-sensitive weak areas. This is avoided when a thick-walled tube section is first turned to the necessary inner dimension, followed by polishing, after which it is reduced to.

The required thickness by turning off its outer side. The Cu substrate cylinders can alternatively be formed directly with a correspondingly smaller surface roughness of <1 $\mu m$ by electrodeposition on a correspondingly smooth, dead mold.

A step which further increases the strength of the hot-cathode element occurs when in the axial direction the anode and a cathode extending axially thereto are reciprocated and rotated relative to one another. The resultant reduction of thickness fluctuations of the deposited layers in the circumferential direction also improves the operating properties of the hot-cathode element.

Also effective is a known step where the hot-cathode element, after completion of the CVD layers and/or after separation from the substrate member, is subjected to a thermal treatment which eliminates mechanical stresses. The thermal treatment is then preferably performed within the framework of the cathode activation.

A Cu substrate cylinder can be separated from the hot-cathode element deposited on it, for example, by melting the Cu. In such a case remaining of residual Cu in the area where the substrate cylinder is supported can be prevented by arranging a circular collecting pan underneath the cylinder in a manner such that the pan contacts the cylinder.

Notably for the manufacture of a hot-cathode element consisting of numerous PCVD layers, as is preferred in accordance with the invention, a very high power density of the plasma and notably of the direct current glow discharge is desired. This can be achieved by enhancing the ionization occurring during the PCVD process due to glow discharge by means of a magnetic field.

A superposed axial magnetic field which is generated by a coil wound on the outside, for example on the cylindrical heating jacket, if necessary a superconducting coil, so as to have a field strength of up to 1 Tesla, ensures a higher ionization degree and a higher power density in the plasma due to the cyclotron motion of the electrons and ions.

A hot-cathode element manufactured by means of one of the described methods has a hollow cylindrical shape and can be used as such, for example, for a high-frequency tube or similar tube. From such a hollow-cylindrical element it is also possible to form hot-cathode elements having a different shape, for example, disc-shaped or strip-shaped elements, preferably by means of an electron beam operation. These elements can be used, for example, in known cathode ray tubes for X-ray analysis (fixed-anode tubes) or for medical rotary-anode X-ray tubes. Hot-cathode elements of this kind are preferably subjected after manufacture and/or after building in, to a thermal treatment for elimination of stresses and can advantageously replace customary filaments or indirectly heated flat cathodes.

Figure 2:
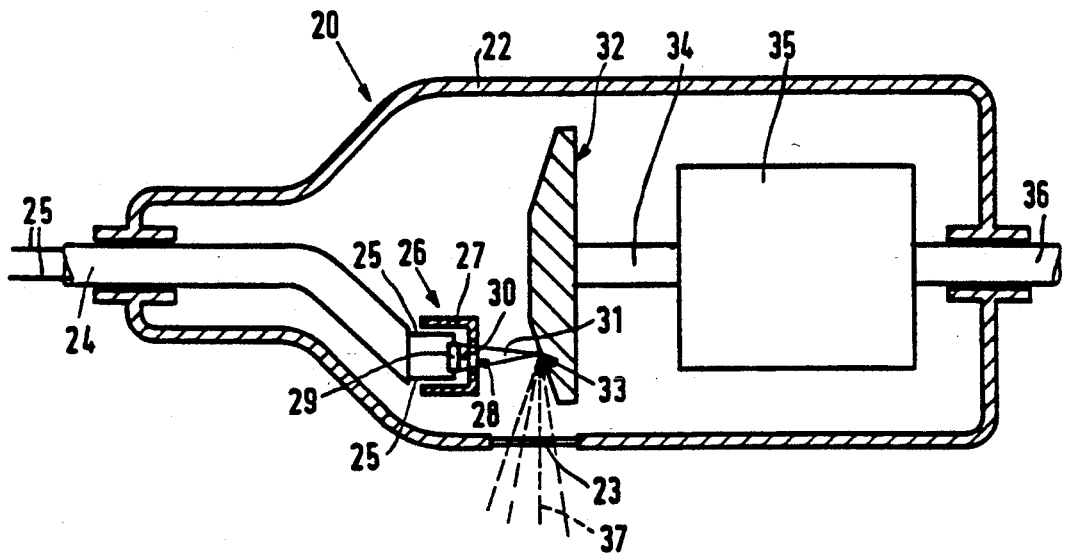
FIG. 2 is a cross-sectional view of a rotary anode x-ray tube suitable for a medical diagnosis apparatus.

The invention will be described in detail hereinafter with reference to the drawing. In the drawing shows FIG. 1 a diagrammatic sectional view of a device for carrying out glow-discharge-activated reactive depositions;

FIG. 2 a rotary anode X-ray tube notably for medical diagnostics apparatus and

Figure 3:
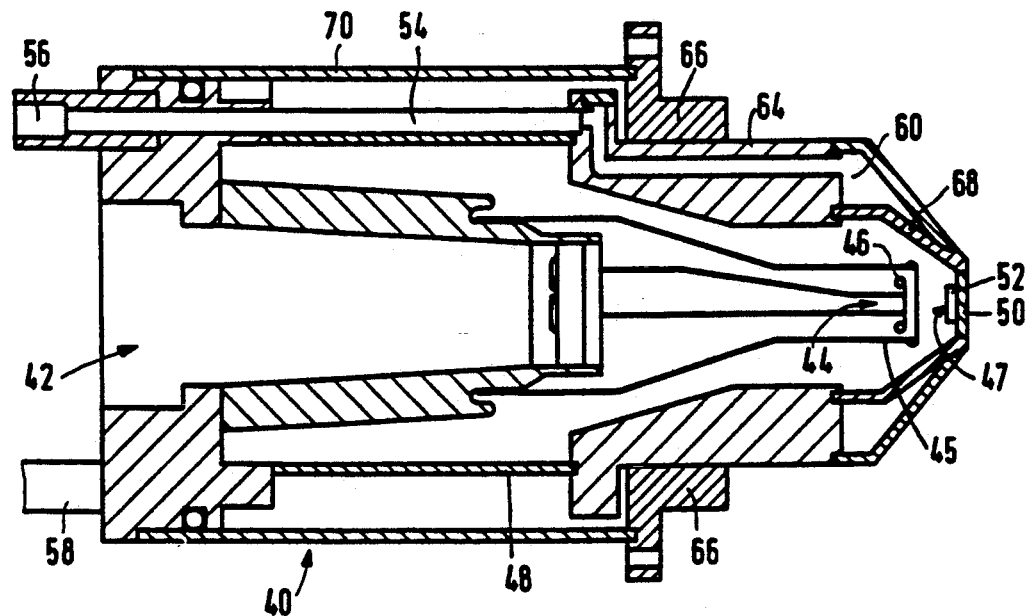
FIG. 3 is a cross-sectional view of an x-ray tube suitable for an x-ray analysis apparatus.

FIG. 3 an X-ray tube notably for X-ray analysis apparatus.

The Figure diagrammatically shows a detail at the area of a reaction chamber. In an encasing tube 1a, being made of, for example quartz and having an insert 1b of high-grade steel which can be inserted one into the other, substrate cylinders 2 which are made of copper are coaxially stacked on a high-grade steel or Cu ring 3. The ring 3 is connected to the negative pole of a direct voltage source (not shown).

Around the encasing tube 1a there are wound heating windings 5 which keep the substrate cylinders 2 at a defined temperature of, for example 500° C. or more. Coaxially within the encasing tube 1 there is arranged an inner electrode which is connected as an anode 6 to the positive pole of the direct voltage source (not shown). In the axial direction the anode 6 is displaceable (double arrow 10) and rotatable (double arrow 4) via a drive (not shown). The mounting rod 7, made of a high-grade steel, for the anode 6 is enclosed by an insulating sleeve 8a made of Al$_2$O$_3$ ceramic. Just before the anode 6 there commences a circumferential groove 9 which has a width of approximately 1 mm and a depth of several centimeters and which prevents an electrically conductive through-growth. At least in the vicinity of the anode 6, the insulating sleeve 8a is enclosed by an outer sleeve 8b which consists of a material for preventing peeling off of electrically conductive growth. A material of this kind is, for example electrographite. The assembly consisting of the anode 6, the mounting rod 7 and the shielding cylinders 8a and 8b is axially displaceable and rotatable. A glow discharge 11 takes place between the anode 6 and the substrate cylinders 2.

The encasing tube 1a is retained between tube sections 14 and 15 via sealing rings 12 and 13. Gas is supplied in the direction of the arrow 16 at the side which is remote from the anode. Gas is removed at the anode side in the direction of the arrow 17.

The reference numeral 18 denotes a possibly necessary superconducting excitation winding which produces a magnetic steady field of up to 1 Tesla in the direction of the arrow 19.

Instead of the rotary movement of the anode 6, it would be possible to journal the encasing tube 1 so as to be rotatable within the heating winding 5. In that case the seals 12 and 13 should be configured so that they enable rotation of the encasing tube 1 during the deposition of PCVD layers on the inner surface of the substrate cylinders 2. The supply of current to the copper ring 3 should then take place via a sliding contact.

After deposition of a plurality of W and ThO$_2$ layers on the substrate cylinders 2, in which, after the deposition of each of the tungsten carbide sub-layers, decarburizing with an Ar/O$_2$ plasma is carried out in accordance with the invention, the substrate cylinders with the hot-cathode elements deposited on their inner surface are removed from the reactor. Preferably, after a stabilizing thermal treatment, the copper substrate cylinders 2 provided with the layers are arranged on a ring pan so that their axes extend perpendicularly. The copper is melted loose from the hot-cathode elements and collected by the ring pan. The ring pan prevents the lower ring side of the hot-cathode element from remaining in contact with molten metal.

The hot-cathode elements which are still carbon-free and hence less brittle can be carburized in a hydrocarbon atmosphere after being mounted on a supporting means required for building into a tube.

A rotating anode X-ray tube to be used particularly for medical diagnostics as given in FIG. 2 comprises a wall 22 with an X-ray exit window 23. The wall 22 furthermore accommodates a passage 24 for supply conductors 25 for a cathode 26. The cathode 26 here comprises a focussing anode 27 with an opening 28 for electrons to be focussed on the anode surface in order to generate X-rays. The cathode further comprises a hot-cathode element 29 according to the invention having an adapted shape and geometry to furnish a controllable dense electron beam 31. To this end the element 29 preferably is provided with a flat emitting surface 30. During operation the filament thus emits an electrom beam 31 which is accelerated in the direction of an anode 32 and which is incident on this anode at a target spot 33. Through is shaft 34, the anode 32 is rotated by a drive system 35 at a revolution speed of, for example, 9,000 r.p.m. Through a passage 36 in the wall 22, supply conductors for the rotating anode device are passed through the tube wall. As a result of the rotation of the anode 32, the target spot described a circular target spot path and a beam of X-rays 37 is generated which departs through the window 23.

FIG. 3 shows another example of an X-ray tube notably to be used for X-ray analysis and comprising an envelope 40 herewith a conical ceramic base 42, a cathode 44 with an emissive element 46 being ring-shaped in order to generate a conical electron beam with the aid of an anode 45 to be focussed on an anode surface 47 in the form of a point or of a ring depending on the measuring mode in the apparatus. The ring-shaped emissive element 46 being a hot-cathode element preferably cut from a cylinder-shaped element as a product of the method according to the invention and enables the generation of a dense electron beam during a long lifetime. The tube further comprises a cylindrical wall 48 and an exit window 50. An anode 52 is provided in the form of a layer of anode material on an inner side of the exit window 50. The anode consists of, for example chromium, rhodium, scandium or another anode material. The thickness of the layer is adapted to the desired radiation, the radiation absorption properties of the material, notably to the electron absorption thereof, and to the desired high voltage for the tube.

In the envelope there is provided a cooling duct 54 with an inlet 56, an outlet 58 and a flow duct 60 which encloses the exit window.

Around the envelope there is provided a mounting bush 64 with a mounting flange 66 and an additional radiation screen 68 which also serves to bound the flow duct 60. Around the tube there is also arranged a thin-walled mounting bush 70 in which the cooling ducts are accommodated and which can have a temperature-equalizing effect on the X-ray tube such that thermal geometry deviations for example in the cathode-anode spacing are avoiding enabling a well defined focussing of the electron beam on the anode.

We claim:

1. A method of manufacturing a hot-cathode element from a rare-earth oxide doped refractory metal wherein a plurality of sub-layers of the rare-earth oxide doped refractory metal are successively deposited on a substrate member (2) by means of a CVD (chemical vapor deposition) process, characterized in that during the course of said CVD process, a decarburizing treatment is carried out subsequent to deposition of each of said sub-layers and, after completion of the CVD process, and after separation from the substrate and being provided with a supporting member, the resultant hot-cathode element is carburized.

2. A method as claimed in claim 1, characterized in that each sub-layer of the rare-earth oxide doped refractory metal are formed by layers of a refractory metal and of a rare-earth oxide which layers are ultimately deposited on the substrate member (2) and after the deposition of each rare-earth oxide layer a decarburizing treatment with a plasma is carried out.

3. A method as claimed in claim 2, characterized in that the refractory metal is tungsten and that after deposition of a tungsten layer, a $H_2/Ar$ plasma discarburizing treatment is carried out.

4. A method as claimed in claim 2, characterized in that the refractory metal is tungsten and after the deposition of each tungsten layer, a $H_2/Ar$ plasma decarburizing treatment is carried out.

5. A method of claim 1 characterized in that the rare-earth oxide is $ThO_x$ and the decarburizing treatment is carried out by means of an $Ar/O_2$ plasma.

6. A method as claimed in claim 1, characterized in that the sub-layers of the hot-cathode element are deposited on the inner wall of a cylindrical substrate member (2).

7. A method as claimed in claim 1, characterized in that the sub-layers are deposited by plasma-activated CVD (PCVD).

8. A method as claimed in claim 1, characterized in that an anode (6) and a cathode are moved relative to one another during the deposition of the sub-layers.

9. A method as claimed in claim 1, characterized in that the hot-cathode element is separated from the substrate member and is subsequently carburized.

* * * * *

UNITED STATES PATENT AND TRADEMARK OFFICE
CERTIFICATE OF CORRECTION

PATENT NO. : 5,283,085
DATED : February 1, 1994
INVENTOR(S) : Georg Gartner

It is certified that error appears in the above-indentified patent and that said Letters Patent is hereby corrected as shown below:

Col. 2, line 40, should be --to the required thickness by turning off its outer side--;

line 41, should be cancelled in its entirety.

Col. 3, line 38, "The Figure" should be --Figure 1--.

Col. 4, line 51, "is" (first occurrence) should be --a--.

Signed and Sealed this

Sixteenth Day of August, 1994

Attest:

BRUCE LEHMAN

Attesting Officer          Commissioner of Patents and Trademarks